(12) United States Patent
Kobayashi (10) Patent No.: US 6,643,307 B2
(45) Date of Patent: Nov. 4, 2003

(54) SEMICONDUCTOR LASER DEVICE

(75) Inventor: Yasuhiro Kobayashi, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 111 days.

(21) Appl. No.: 09/764,273

(22) Filed: Jan. 19, 2001

(65) Prior Publication Data

US 2002/0146048 A1 Oct. 10, 2002

(30) Foreign Application Priority Data

Jan. 24, 2000 (JP) ........................................ 2000-014521

(51) Int. Cl.⁷ ................................................ H01S 5/00
(52) U.S. Cl. ............................. 372/46; 372/40; 372/45
(58) Field of Search ....................... 372/45, 46; 438/40, 438/46

(56) References Cited

U.S. PATENT DOCUMENTS

| | | | | |
|---|---|---|---|---|
| 5,416,790 A | * | 5/1995 | Yodoshi et al. | 372/45 |
| 5,506,170 A | * | 4/1996 | Yodoshi et al. | 438/40 |
| 5,963,572 A | * | 10/1999 | Hiroyama et al. | 372/45 |
| 6,118,800 A | * | 9/2000 | Kidoguchi et al. | 372/45 |
| 6,130,108 A | * | 10/2000 | Uchida | 438/46 |

* cited by examiner

*Primary Examiner*—Paul Ip
*Assistant Examiner*—Tuan Nguyen
(74) *Attorney, Agent, or Firm*—Nixon Peabody LLP; Donald R. Studebaker (57) ABSTRACT

A semiconductor laser device includes: active layer; first cladding layer, which is formed on the active layer and is made of $(Al_{X1}Ga_{1-X1})_{Z1}In_{1-Z1}P$ (where $0 \leq X1 \leq 1$ and $0 < Z1 < 1$) of a first conductivity type; current blocking layer, which is formed on the first cladding layer and is made of $(Al_YGa_{1-Y})_{Z2}In_{1-Z2}P$ (where $0 \leq Y \leq 1$ and $0 < Z2 < 1$) of a second conductivity type and has striped region; and second cladding layer, which is formed at least in the striped region and is made of $(Al_{X2}Ga_{1-X2})_{Z3}In_{1-Z3}P$ (where $0 \leq X1 \leq 1$ and $0 < Z3 < 1$) of the first conductivity type. X1, X2 and Y have relationships represented as Y>X1 and Y>X2. Saturable absorption region absorbing laser light produced from the active layer is formed in part of the active layer under the current blocking layer.

5 Claims, 7 Drawing Sheets

FIG. 5B $\Delta\lambda < 0.2\,\text{nm}$

FIG. 5C $\Delta\lambda > 1\,\text{nm}$

SEMICONDUCTOR LASER DEVICE

BACKGROUND OF THE INVENTION

The present invention relates to a semiconductor laser device, and more particularly relates to a self-sustained pulsation type semiconductor laser device that emits red laser light.

A red-light-emitting semiconductor laser is widely used as a light source for a DVD apparatus. Also, a self-sustained pulsation type semiconductor laser device does not need an external high frequency modulation circuit for reducing external optical feed back noise and therefore can be a key device in terms of size and cost reduction.

Hereinafter, a typical known structure for a self-sustained pulsation type semiconductor laser device will be described with reference to FIG. 8.

Figure 8:
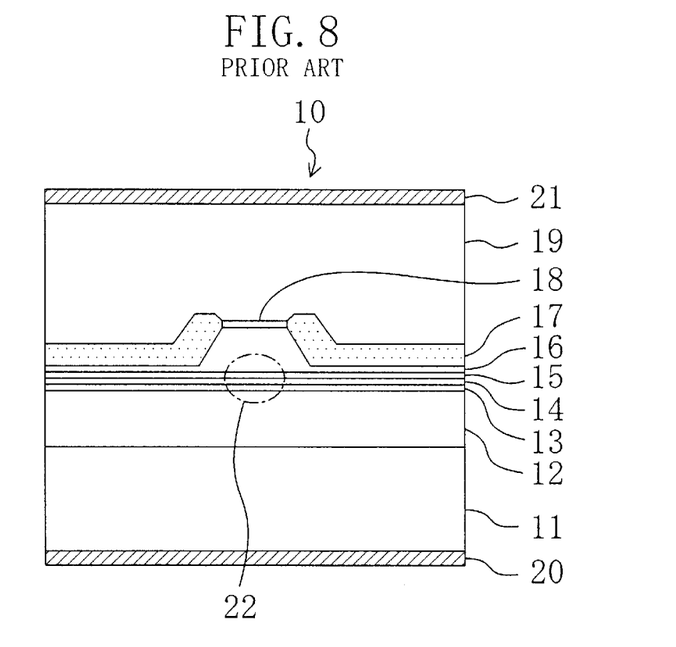
FIG. 8 is a cross-sectional view of a known semiconductor laser device.

FIG. 8 illustrates a cross-sectional structure for a known semiconductor laser device 10. N-type cladding layer 12 made of an n-type AlGaInP layer; active layer 13 with a multiple quantum well structure; first p-type cladding layer 14 made of a p-type AlGaInP layer; saturable absorption layer 15; and second p-type cladding layer 16, which is made of a p-type AlGaInP layer and has a ridge portion, are stacked in this order over an n-type GaAs substrate 11. That is to say, the saturable absorption layer 15 is inserted between the first and second p-type cladding layers 14 and 16.

A current blocking layer 17 of an n-type GaAs layer is formed on the second p-type cladding layer 16 to cover both sides of the ridge portion. A contact layer 18 is formed on part of the ridge portion of the second p-type cladding layer 16, which is sandwiched by the current blocking layer 17. And a cap layer 19 of a p-type GaAs layer is formed on the current blocking and contact layers 17 and 18.

Further, an n-side electrode 20 is formed on the lower surface of the n-type GaAs substrate 11, while a p-side electrode 21 is formed on the upper surface of the cap layer 19.

In order to fabricate the known semiconductor laser device, n-type AlGaInP layer to be the n-type cladding layer 12; active layer 13; p-type AlGaInP layer to be the first cladding layer 14; saturable absorption layer 15; p-type AlGaInP layer to be the second p-type cladding layer 16; and contact layer 18 are stacked in this order over the n-type GaAs substrate 11 by a crystal growth process (i.e., first growth process). Thereafter, the second cladding layer 16 and contact layer 18 are etched and patterned to form a ridge portion. Next, an n-type GaAs layer to be the current blocking layer 17 are selectively formed on both sides of the ridge of the second cladding layer 16 by another crystal growth process (i.e., second growth process). Subsequently, a p-type GaAs layer to be the cap layer 19 is formed on the contact and current blocking layers 18 and 17 by another crystal growth process (i.e., third growth process).

The distribution 22 of laser light, emitted from the active layer 13, is confined in a part of the active layer 13 under the ridge portion. However, self-sustained pulsation is realized because the saturable absorption layer 14 exists within the range in which the light is distributed.

Figure 9:
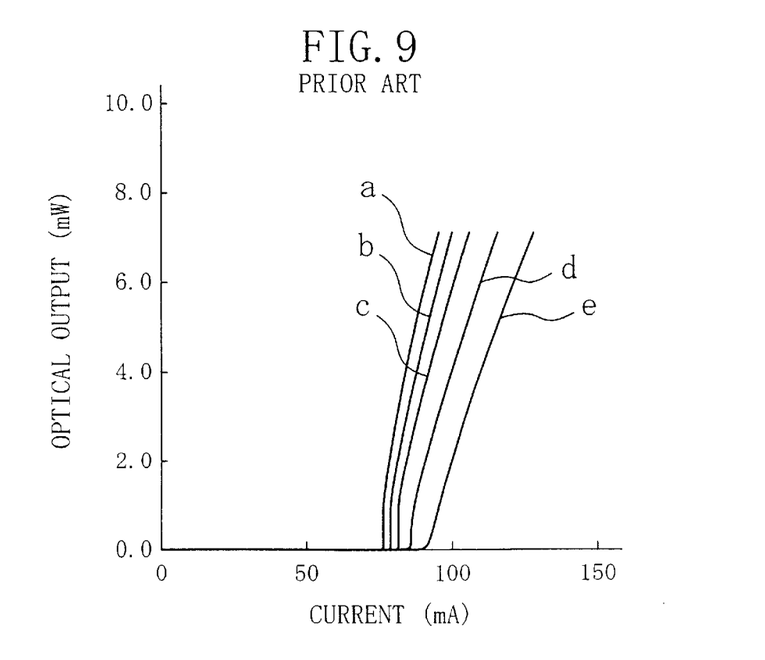
FIG. 9 is a graph illustrating the optical output-current characteristics of the known semiconductor laser device.

FIG. 9 illustrates the optical output-current characteristic of the known semiconductor laser device. In FIG. 9, curves a, b, c, d and e represent the characteristics of the semiconductor laser device at temperatures of 20° C., 30° C., 40° C., 50° C. and 60° C., respectively. As can be seen from FIG. 9, non-continuous characteristics resulting form the self-sustained pulsation is observable in the vicinity of the threshold current. It should be noted that the operating current is 86.6 mA when the optical output is 5 mW at room temperature (25° C.).

However, in the known semiconductor laser device, the current blocking layer 17 is made of GaAs and therefore absorbs a great deal of red laser light emitted from the active layer 13. For that reason, the internal loss at the optical waveguide is as large as about 20 $cm^{-1}$, thus causing a problem that the operating current of the semiconductor laser device increases.

Furthermore, increased heat is generated from the semiconductor laser device due to the large operating current, and the known semiconductor laser device cannot be built in an optical pickup apparatus for a DVD, which is in the highest demand now. As a result, the known semiconductor laser device is not suitable for practical use.

Moreover, the known self-sustained pulsation type semiconductor laser device needs to perform three crystal growth processes as described above. Accordingly, the device has a problem that it is difficult to cut down the cost required.

SUMMARY OF THE INVENTION

In view of the foregoing, it is a first object of the present invention to realize a self-sustained pulsation type semiconductor laser device having a low operating current. It is a second object of the present invention to get the device fabricated by two crystal growth processes.

To achieve these objects, a semiconductor laser device according to the present invention includes: an active layer; a first cladding layer, which is formed on the active layer and is made of $(Al_{X1}Ga_{1-X1})_{Z1}In_{1-Z1}P$ (where $0 \leq X1 \leq 1$ and $0 < Z1 < 1$) of a first conductivity type; a current blocking layer, which is formed on the first cladding layer and is made of $(Al_YGa_{1-Y})_{Z2}In_{1-Z2}P$ (where $0 \leq Y \leq 1$ and $0 < Z2 < 1$) of a second conductivity type and has a striped region; and a second cladding layer, which is formed at least in the striped region and is made of $(Al_{X2}Ga_{1-X2})_{Z3}In_{1-Z3}P$ (where $0 \leq X1 \leq 1$ and $0 < Z3 < 1$) of the first conductivity type. X1, X2 and Y have relationships represented as Y>X1 and Y>X2. A saturable absorption region for absorbing laser light produced from the active layer is formed in part of the active layer. The part is located under the current blocking layer.

In the semiconductor laser device of the present invention, the aluminum mole fraction (Y) of the current blocking layer is greater than the aluminum mole fraction (X1) of the first cladding layer or the aluminum mole fraction (X2) of the second cladding layer. Therefore, the bandgap energy of each of the first cladding layer, current blocking layer and second cladding layer can be made greater than the energy corresponding to the oscillation wavelength of the laser light produced from the active layer.

Thus, the first cladding layer, current blocking layer and second cladding layer are transparent to the laser light emitted from the active layer, and it is possible to prevent the laser light from being absorbed into the first cladding layer, current blocking layer and second cladding layer, or the current blocking layer among other things. As a result, the semiconductor laser device of the present invention can reduce its operating current.

Also, the current blocking layer is transparent to the laser light, and the distribution of the laser light emitted from the part of the active layer located under the striped region can be easily expanded to other parts of the active layer located under the current blocking layer. Accordingly, the saturable absorption region for absorbing the laser light produced from the active layer can be formed in those parts of the active layer located under the current blocking layer. As a result, the semiconductor laser device of the present invention realizes self-sustained pulsation.

Further, in this structure, the current blocking layer has the striped region and the second cladding layer is formed in the striped region. Accordingly, only two crystal growth processes are needed, and the fabrication cost of the semiconductor laser device can be reduced.

In the semiconductor laser device of the present invention, an effective refractive index difference between the inside and outside of the striped region, which is a difference between first and second effective refractive indices, is preferably equal to or greater than $2\times10^{-3}$ and equal to or smaller than $5\times10^{-3}$. The first effective refractive index is determined by a semiconductor multilayer structure existing inside the striped region to vertically sandwich the striped region therebetween and including the second and first cladding layers and the active layer. The second effective refractive index is determined by another semiconductor multilayer structure existing outside of the striped region to vertically sandwich the striped region therebetween and including the current blocking layer, the first cladding layer and the active layer.

In that case, the size of the saturable absorption region formed in the active layer can be moderate, and good self-sustained pulsation is obtainable.

In the semiconductor laser device of the present invention, the active layer preferably has a quantum well structure formed by stacking multiple quantum well layers and barrier layers one upon the other, and a total thickness of the quantum well layers is preferably 0.03 µm or more. In such a case, good self-sustained pulsation can be obtained.

In the semiconductor laser device of the present invention, the first cladding layer preferably has a thickness of 0.10 µm or more and 0.45 µm or less. In such a case, good self-sustained pulsation is obtainable.

BRIEF DESCRIPTION OF THE DRAWINGS

FIGS. 2(a) through 2(e) illustrate how the semiconductor laser device according to an embodiment of the present invention realizes self-sustained pulsation.

DESCRIPTION OF THE PREFERRED EMBODIMENTS

Hereinafter, a semiconductor laser device according to an embodiment of the present invention will be described with reference to the drawings.

Figure 1:
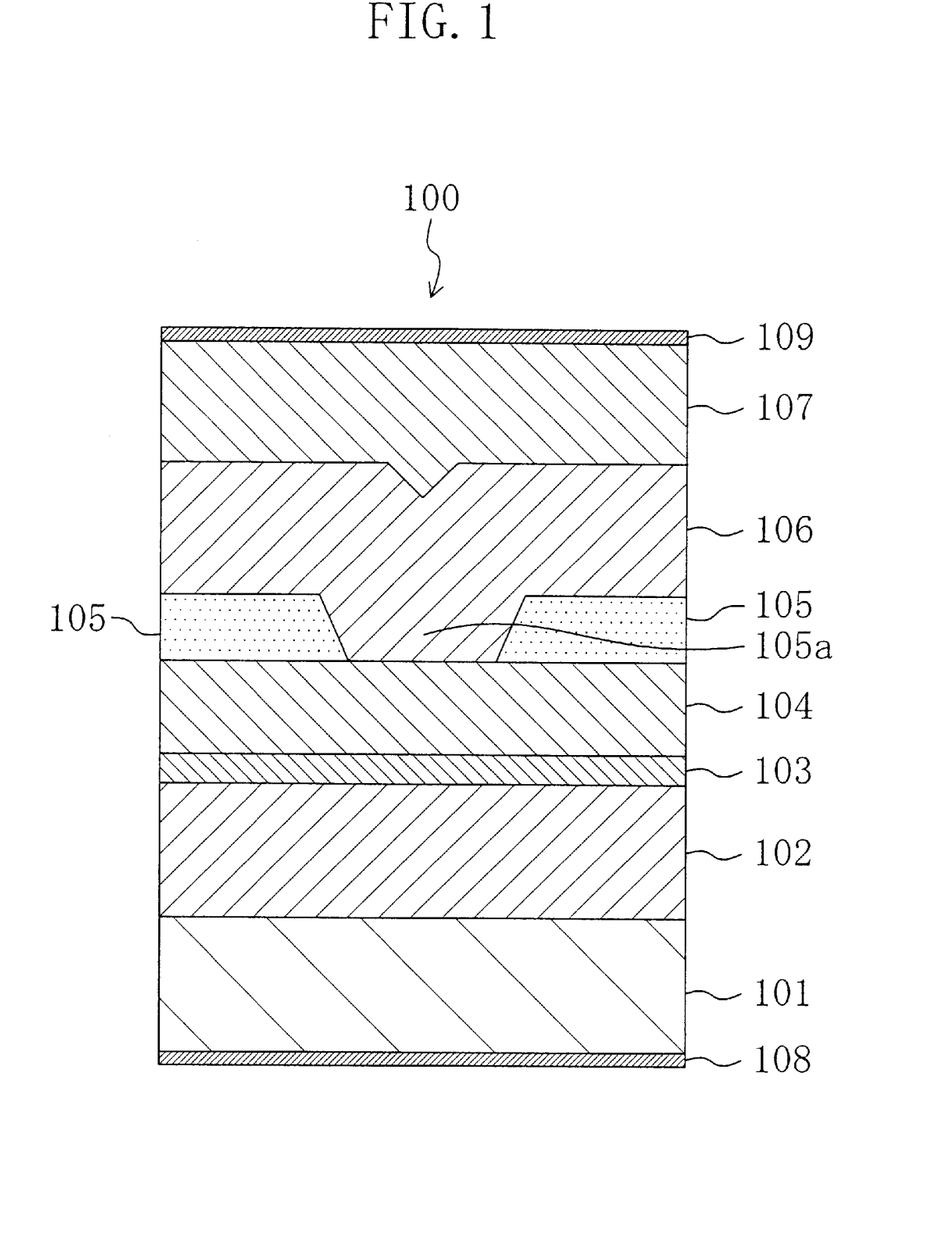
FIG. 1 is a cross-sectional view of a semiconductor laser device according to an embodiment of the present invention.

FIG. 1 illustrates a cross-sectional structure for a semiconductor laser device 100 according to an embodiment. As shown in FIG. 1, n-type cladding layer 102 made of an n-type AlGaInP layer; active layer 103 with a multiple quantum well structure; first p-type cladding layer 104 made of p-type $(Al_{X1}Ga_{1-X1})_{Z1}In_{1-Z1}P$ (where $0 \leq X1 \leq 1$ and $0<Z1<1$); current blocking layer 105, which is made of n-type $Al_YGa_{1-Y})_{Z2}In_{1-Z2}P$ (where $0 \leq Y \leq 1$ and $0<Z2<1$) and has a striped region 105a; second p-type cladding layer 106 made of p-type $(Al_{X2}Ga_{1-X2})Z_3In_{1-Z3}P$ (where $0 \leq X1 \leq 1$ and $0<Z3<1$); and contact layer 107 made of a p-type GaAs layer are stacked in this order over an n-type GaAs substrate 101. It should be noted that the active layer has a multiple quantum well structure including eight quantum well layers made of GaInP and nine barrier layers made of $Al_XGa_{1-X}InP$ (where $0 \leq X \leq 1$). Also, an n-side electrode 108 is formed on the lower surface of the n-type GaAs substrate 101, while a p-side electrode 109 is formed on the upper surface of the contact layer 107.

A method for fabricating the semiconductor laser device of this embodiment is as follows.

First, n-type AlGaInP layer to be the n-type cladding layer 102; multiple GaInP layers (quantum well layers) and multiple $Al_XGa_{1-X}InP$ layers (where $0 \leq X \leq 1$) (barrier layers), which will together make the active layer 103; p-type $(Al_{X1}Ga_{1-X1})Z_1In_{1-Z1}P$ (where $0 \leq X1 \leq 1$ and $0<Z1<1$) layer to be the first p-type cladding layer 104; and n-type $(Al_YGa_{1-Y})_{Z2}In_{1-Z2}P$ (where $0 \leq Y \leq 1$ and $0<Z2<1$) layer to be the current blocking layer 105 are stacked in this order over the n-type GaAs substrate 101 by a crystal growth process (i.e., first growth process). Thereafter, the n-type $(Al_YGa_{1-Y})_{Z2}In_{1-Z2}P$ is patterned to form the current blocking layer 105 with the striped region 105a.

Next, a p-type $(Al_{X2}Ga_{1-X2})_{Z3}In_{1-Z3}P$ (where $0 \leq X2 \leq 1$ and $0<Z3<1$) layer to be the second p-type cladding layer 106 and a p-type GaAs layer to be the contact layer 107 are stacked in this order on part of the first p-type cladding layer 104, which is exposed in the striped region 105a, and over the current blocking layer 105 by another crystal growth process (i.e., second growth process). As a result, the semiconductor laser device of this embodiment is obtained.

Accordingly, the semiconductor laser device of this embodiment can be formed by performing these two crystal growth processes, and the cost can be reduced.

In the semiconductor laser device of this embodiment, the aluminum mole fractions (X1, Y and X2) have relationships represented as Y>X1 and Y>X2 among the p-type $(Al_{X1}Ga_{1-X1})_{Z1}In_{1-Z1}P$ (where $0 \leq X1 \leq 1$ and $0<Z1<1$) layer to be the first p-type cladding layer 104, n-type $(Al_YGa_{1-Y})_{Z2}In_{1-Z2}P$ (where $0 \leq Y \leq 1$ and $0<Z2<1$) layer to be the current blocking layer 105 and p-type $(Al_{X2}Ga_{1-X2})_{Z3}In_{1-Z3}P$ (where $0 \leq X2 \leq 1$ and $0<Z3<1$) layer to be the second p-type cladding layer 106.

In the semiconductor laser device of this embodiment, the aluminum mole fraction (Y) of the current blocking layer 105 is greater than the aluminum mole fraction (X1) of the first p-type cladding layer 104 or the aluminum mole fraction (X2) of the second p-type cladding layer 106. Therefore, the bandgap energy of each of the first and second p-type cladding layers 104 and 106 and current blocking layer 105 can be made greater than the energy corresponding to the oscillation wavelength of the laser light produced from the active layer 103.

In this manner, the distribution of the laser light, emitted from part of the active layer 103 under the striped region 105a, can be easily expanded to other parts of the active layer 103 under the current blocking layer 105, because the first and second p-type cladding layers 104 and 106 and current blocking layer 105 are transparent to the laser light emitted from the active layer 103.

On the other hand, the current injection region of the active layer 103 is limited to its part under the striped region 105a by the current blocking layer 105, and no current flows in these parts of the active layer 103 under the current blocking layer 105. Thus, saturable absorption regions for absorbing the laser light emitted from the active layer 103 can be formed. Accordingly, the semiconductor laser device of this embodiment realizes self-sustained pulsation.

Table 1 represents the aluminum mole fractions and thicknesses of the contact layer 107, second p-type cladding layer 106, current blocking layer 105, first p-type cladding layer 104, active layer 103 and n-type cladding layer 102, which together make up the semiconductor laser device of this embodiment.

TABLE 1

| Name | Al mole fractions | Thickness ($\mu$m) |
| --- | --- | --- |
| Contact layer | — | 2.0 |
| Second p-type cladding layer | 0.6 | 1.25 |
| Current blocking layer | 1.0 | 0.6 |
| First p-type cladding layer | 0.7 | 0.25 |
| Active layer | — | 0.1374 |
| n-type cladding layer | 0.7 | 1.06 |

As shown in Table 1, the aluminum mole fraction (Y=1.0) of the current blocking layer 105 is greater than the aluminum mole fraction (X1=0.7) of the first p-type cladding layer 104. And the aluminum mole fraction (Y=1.0) of the current blocking layer 105 is greater than the aluminum mole fraction (X2=0.6) of the second p-type cladding layer 104. It should be noted that, in Table 1, the aluminum mole fraction (Y) of the n-type $Al_YGa_{1-Y})_{Z2}In_{1-Z2}P$ to be the current blocking layer 105 is 1. Alternatively, the aluminum mole fraction does not have to be 1 but the current blocking layer 105 may contain gallium.

Also, the active layer 103 has a multiple quantum well structure including quantum well layers of GaInP and barrier layers of $Al_XGa_{1-X}InP$ (where X=0.5). Accordingly, the oscillation wavelength of the laser light, emitted from the active layer 103, is about 670 nm (corresponding to an energy of 1.85 eV).

The bandgap energy of each of the first and second p-type cladding layers 104 and 106 and current blocking layer 105 is greater than the energy of the laser light emitted from the active layer 103. Therefore, the first and second p-type cladding layers 104 and 106 and current blocking layer 105 are transparent to the laser light emitted from the active layer 103. As a result, the internal loss at the waveguide becomes as small as about several $cm^{-3}$, and the operating current decreases.

In the semiconductor laser device of this embodiment, a first effective refractive index is determined by a semiconductor multilayer structure existing inside the striped region 105a to vertically sandwich the region 105a therebetween and including the second and first p-type cladding layers 106 and 104 and active layer 103. And a second effective refractive index is determined by another semiconductor multilayer structure existing outside of the striped region 105a to vertically sandwich the region 105a therebetween and including the current blocking layer 105, first p-type cladding layer 104 and active layer 103. An effective refractive index difference between the inside and outside of the striped region is a difference between the first and second effective refractive indices and is preferably equal to or greater than $2 \times 10^{-3}$ and equal to or smaller than $5 \times 10^{-3}$.

Hereinafter, a relationship between an effective refractive index difference between the inside and outside of the striped region (which will be herein simply called "an effective refractive index difference") $\Delta n$ ($=n_1-n_2$) and self-sustained pulsation will be described. The effective refractive index difference is a difference between the first effective refractive index $n_1$, which is determined by the semiconductor multilayer structure existing inside the striped region 105a to vertically sandwich the region 105a therebetween and including the second and first p-type cladding layers 106 and 104, active layer 103 and n-type cladding layer 102, and the second effective refractive index $n_2$, which is determined by another semiconductor multilayer structure existing outside of the striped region 105a to vertically sandwich the region 105a therebetween and including the current blocking layer 106, first p-type cladding layer 104, active layer 103 and n-type cladding layer 102. It should be noted that, in this embodiment, the effective refractive index difference $\Delta n$ is set to $3.2 \times 10^{-3}$.

First, it will be described with reference to FIGS. 2(a) through 2(e) how the semiconductor laser device of this embodiment realizes self-sustained pulsation.

FIGS. 2(a), 2(b), 2(c), 2(d) and 2(e) represent the range of the distribution 110 of the laser light emitted from the active layer 103, effective refractive index difference, light distribution, gain distribution and mode gain distribution in the semiconductor laser device of this embodiment, respectively.

Figure 2A:
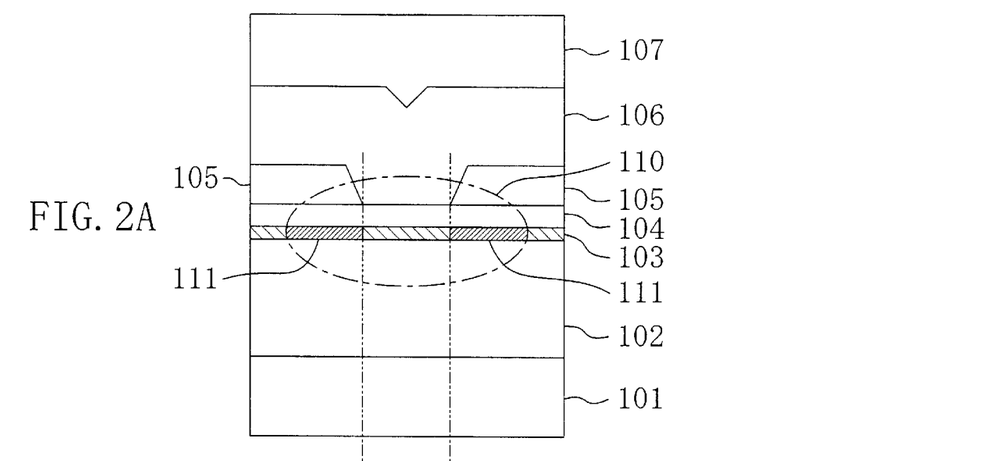
FIGS. 2(a), 2(b), 2(c), 2(d) and 2(e) represent the range of the distribution of the laser light emitted from the active layer, effective refractive index difference, light distribution, gain distribution and mode gain distribution, respectively.
Figure 2B:
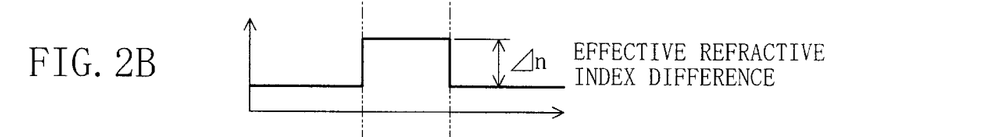

In the semiconductor laser device of this embodiment, the current blocking layer 105 is transparent to the laser light emitted from the active layer 103 as described above. Accordingly, the laser light is hardly absorbed into the current blocking layer 105, and a considerable proportion of the laser light is transmitted through the current blocking layer 105. Further, in this embodiment, the effective refractive index difference $\Delta n$ is set to as small a value as $3.2 \times 10^{-3}$. Accordingly, as shown in FIG. 2(a), the light distribution 110 reaches as far as parts of the first p-type cladding layer 104 and active layer 103, which are located under the current blocking layer 105.

Most of the current injected is confined in the striped region 105a and just a little amount of the current diffuses into the first p-type cladding layer 104. Therefore, as shown in FIG. 2(d), the current distribution (or gain distribution) expands almost no greater than the striped region 105.

Figure 2C:
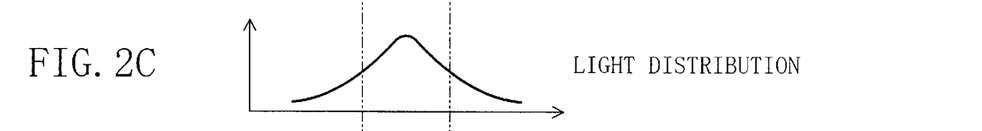
Figure 2D:
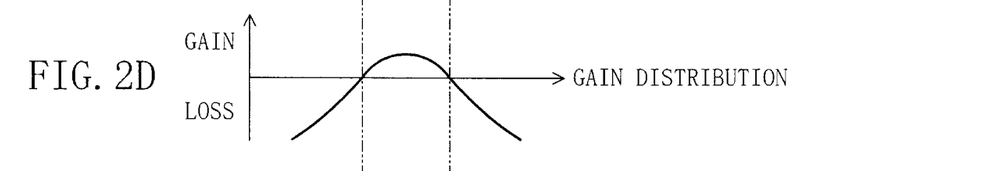
Figure 2E:
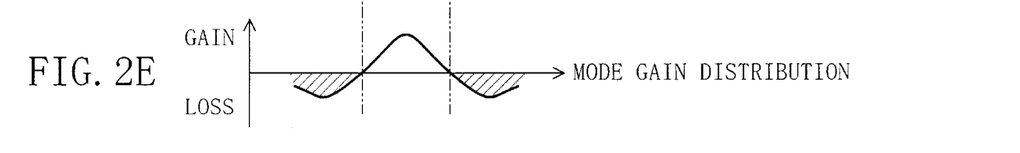

Accordingly, the mode gain distribution, represented as a product of the light distribution shown in FIG. 2(c) and the gain distribution shown in FIG. 2(d), becomes as shown in FIG. 2(e). That is to say, the light distribution 110 reaches the outside of the striped region 105a. However, a gain distributed outside of the striped region 105a means a loss, and the mode gains distributed in the regions outside of the striped region 105a (i.e., hatched regions in FIG. 2(e)) are also losses. Accordingly, as shown in FIG. 2(a), saturable absorption regions 111 are formed in parts of the active layer 103 on both sides of the striped region 105a.

Figure 3:
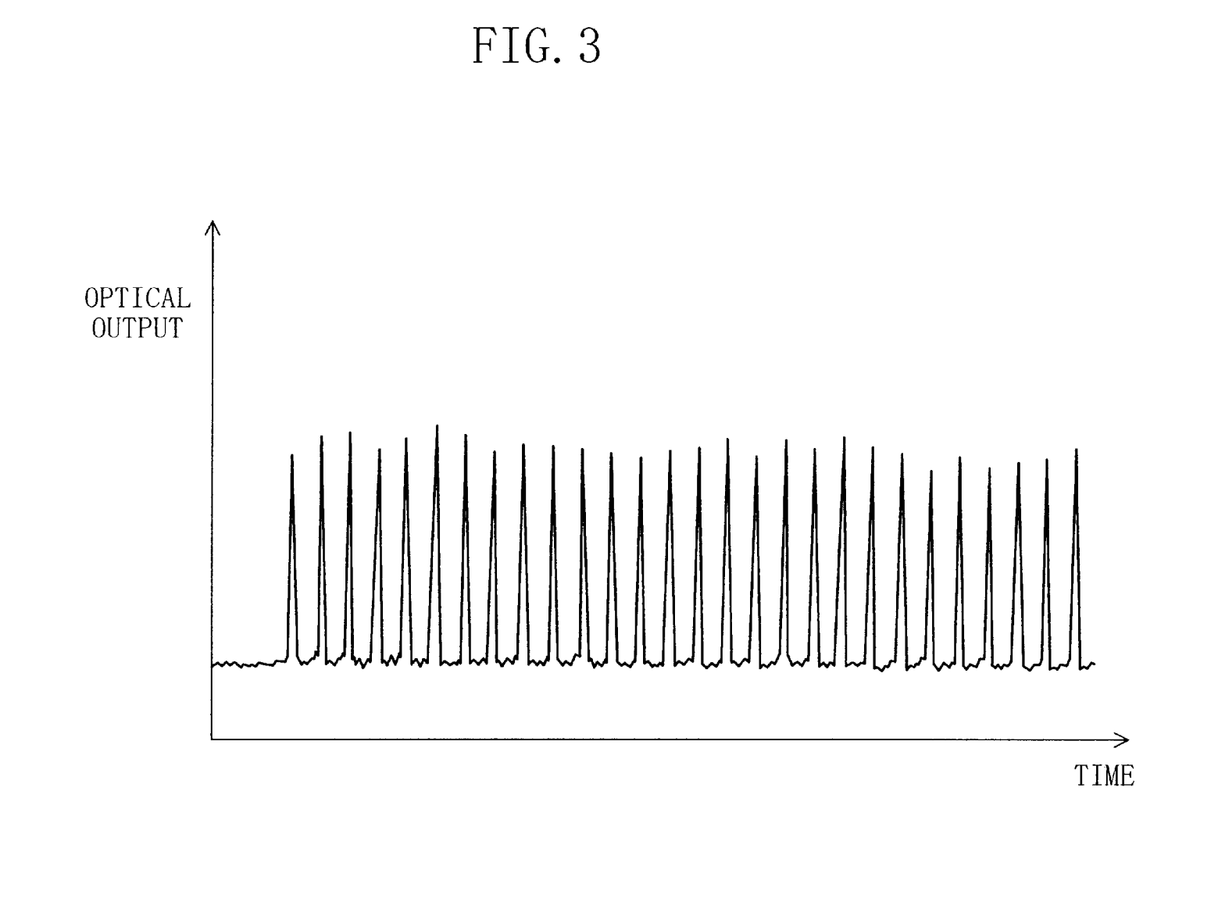
FIG. 3 is a graph representing how the waveform of the optical output changed with time when the semiconductor laser device according to an embodiment of the present invention was allowed to oscillate in the self-sustained manner at room temperature.

FIG. 3 represents how the waveform of the optical output changes with time when the semiconductor laser device of this embodiment is allowed to oscillate in the self-sustained manner at room temperature (25° C.) with its emitting facet uncoated (a state in which no coating layer is formed there). As can be seen from the FIG. 3, a stable optical pulse train is obtained, and satisfactory self-sustained pulsation is realized. It should be noted that the self-sustained pulsation is realized at a frequency of 613 MHz.

Figure 4:
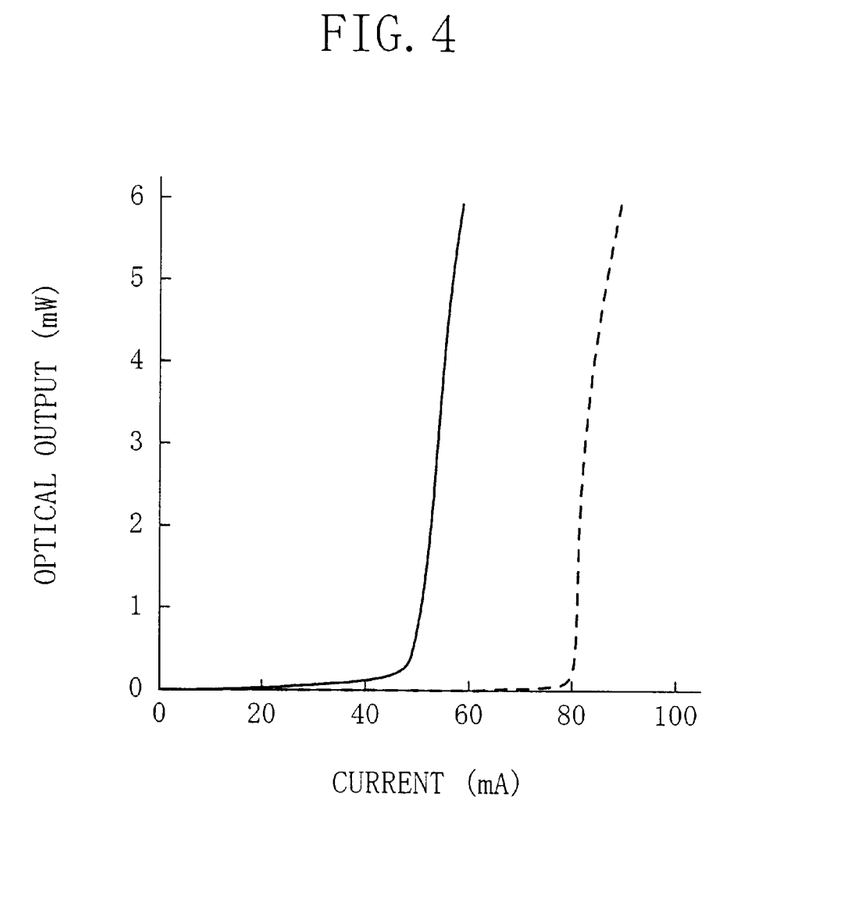
FIG. 4 is a graph representing the optical output-current characteristic of the semiconductor laser device according to an embodiment of the present invention when the device was allowed to oscillate in the self-sustained manner at room temperature.

FIG. 4 represents a result obtained by measuring the optical output-current characteristics of the semiconductor laser device of this embodiment when the device was allowed to oscillate in the self-sustained manner at room temperature with its emitting facet uncoated. In FIG. 4, the solid line represents the characteristics of the semiconductor laser device of this embodiment while the broken line represents the characteristics of a known semiconductor laser device.

As can be seen from FIG. 4, the known semiconductor laser device had an operating current of 86.6 mA at an optical output of 5 mW. In contrast, the semiconductor laser device of this embodiment had an operating current of 56.6 mA at the optical output of 5 mW. Accordingly, it was confirmed that the operating current could be reduced to about two-thirds compared to the known device.

To make the semiconductor laser device oscillate in the self-sustained manner, the saturable absorption regions 111 are necessary. In this embodiment, the current blocking layer 105 is transparent to the laser light emitted from the active layer 103, and the effective refractive index difference $\Delta n$ can be set to a small value. For that reason, the light distribution 110 can be expanded greatly out of the striped region 105a, and saturable absorption regions 111, which are large enough to realize the self-sustained pulsation, can be obtained.

Hereinafter, a preferred range of the effective refractive index difference $\Delta n$ for realizing good self-sustained pulsation will be described.

If the effective refractive index difference $\Delta n$ is smaller than $2 \times 10^{-3}$, the light distribution 110 expands excessively and the saturable absorption regions 111 broadens too much. Therefore, no matter how much current is injected, the absorption of the laser light is not saturated. That is to say, the saturable absorption regions 111 function as a mere absorber, and the self-sustained pulsation does not occur. Also, if the effective refractive index difference $\Delta n$ is smaller than $2 \times 10^{-3}$, then the waveguide structure will be an index-antiguided one. As a result, the transverse mode becomes very unstable.

On the other hand, if the effective refractive index difference $\Delta n$ is greater than $5 \times 10^{-3}$, the light distribution 110 narrows and the saturable absorption regions 111 can not function properly. As a result, no self-sustained pulsation occurs.

Accordingly, to realize good self-sustained pulsation, the effective refractive index difference $\Delta n$ needs to be equal to or greater than $2 \times 10^{-3}$ and equal to or smaller than $5 \times 10^{-3}$.

Figure 5A:
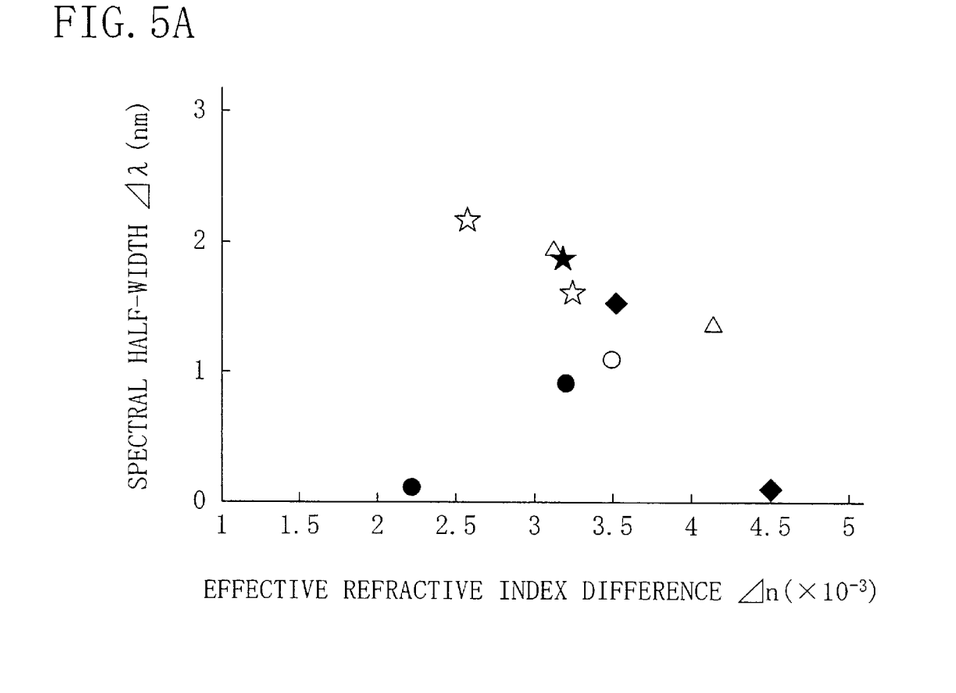
FIG. 5(a) is a graph representing a relationship between the effective refractive index difference and spectral half-width when the semiconductor laser device according to an embodiment of the present invention was allowed to oscillate.
Figure 5B:
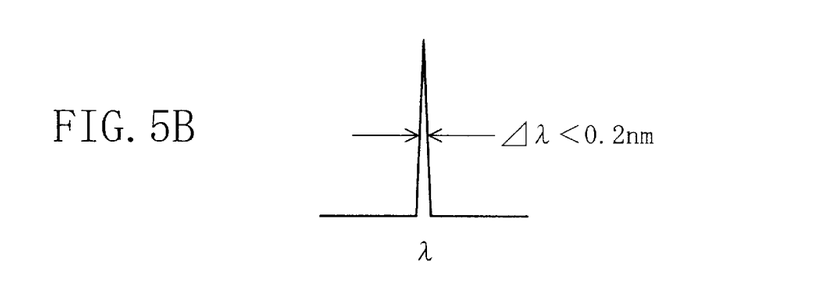
FIG. 5(b) represents the spectrum of laser light oscillating in a longitudinal single mode.
Figure 5C:
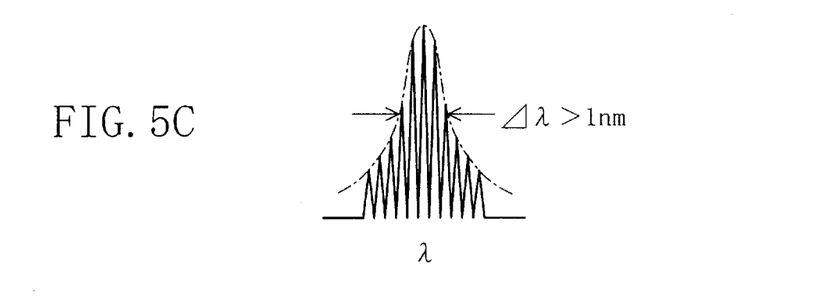
FIG. 5(c) represents the spectrum of laser light oscillating in longitudinal multi-modes.

FIG. 5(a) shows results obtained by analyzing a relationship between the effective refractive index difference $\Delta n$ and spectral half-width when the laser was allowed to oscillate with the number of quantum well layers included in the active layer 103 and the thickness of the first p-type cladding layer 104 changed in the semiconductor laser device of this embodiment. FIG. 5(b) represents the spectrum of the laser light oscillating in a longitudinal single mode while FIG. 5(c) represents the spectrum of the laser light oscillating in longitudinal multi-modes. When oscillating in the self-sustained manner, the laser light has a longitudinal multi-mode spectrum, and the spectral half-width becomes about 1 nm. Accordingly, by measuring the spectral half-width, it is possible to determine whether self-sustained pulsation is realized or not.

In FIG. 5(a), ♦ indicates that the number of well layers is seven and that the thickness of the first cladding layer 104 is 0.15 $\mu$m. ● indicates that the number of well layers is seven and that the thickness of the first cladding layer 104 is 0.20 $\mu$m. ★ indicates that the number of well layers is seven and that the thickness of the first cladding layer 104 is 0.25 $\mu$m. ○ indicates that the number of well layers is eight and that the thickness of the first cladding layer 104 is 0.20 $\mu$m. ☆ indicates that the number of well layers is eight and that the thickness of the first cladding layer 104 is 0.25 $\mu$m. And △ indicates that the number of well layers is eight and that the thickness of the first cladding layer 104 is 0.30 $\mu$m.

Based on FIG. 5(a), it could be confirmed that if the effective refractive index difference $\Delta n$ was equal to or greater than $2.5 \times 10^{-3}$ and equal to or smaller than $4.2 \times 10^{-3}$, self-sustained pulsation was realized. According to the results shown in FIG. 5(a), where the effective refractive index difference $\Delta n$ was equal to or smaller than $2.5 \times 10^{-3}$ and equal to or greater than $4.2 \times 10^{-3}$, self-sustained pulsation was not realized. However, if the effective refractive index difference $\Delta n$ is $2 \times 10^{-3}$ or more and $5 \times 10^{-3}$ or less, self-sustained pulsation is realizable by optimizing the number of quantum well layers, total thickness of the quantum well layers in the active layer 103 or the thickness of the first p-type cladding layer 104.

Hereinafter, a relationship between the total thickness of the quantum well layers in the active layer 103 (overall thickness of the well layers) and the self-sustained pulsation characteristics will be described.

Figure 6:
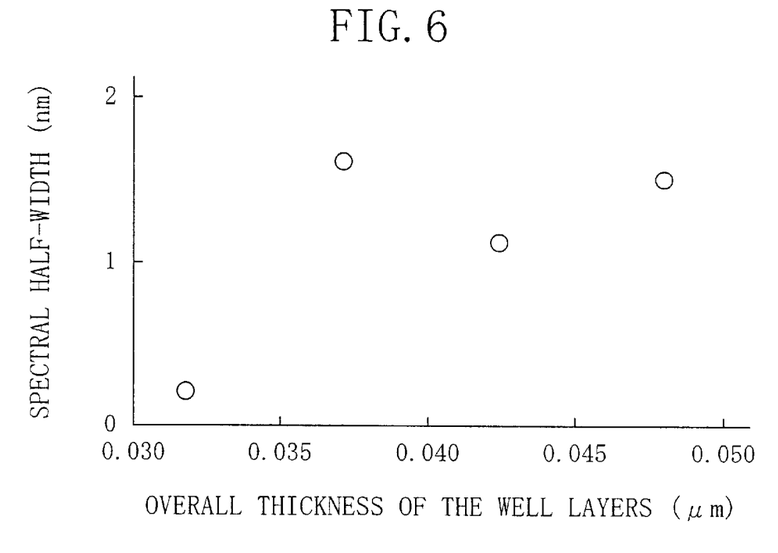
FIG. 6 is a graph representing relationships between the overall thickness of the well layers and spectral half-widths in the semiconductor laser device according to an embodiment of the present invention.

FIG. 6 represents relationships between the overall thickness of the well layers and spectral half-widths where the effective refractive index difference $\Delta n$ was set to about $3.2 \times 10^{-3}$. In FIG. 6, ○ indicate, from the left, six well layers each having a thickness of 0.0053 $\mu$m (overall thickness: 0.0053×6 $\mu$m), seven well layers each having a thickness of 0.0053 $\mu$m (overall thickness: 0.0053×7 $\mu$m), eight well layers each having a thickness of 0.0053 $\mu$m (overall thickness: 0.0053×8 $\mu$m) and six well layers each having a thickness of 0.0080 $\mu$m (overall thickness: 0.0080×6 $\mu$m).

As can be seen from FIG. 6, if the total thickness of the quantum well layers is about 0.035 $\mu$m or more, self-sustained pulsation is realized. In other words, it can be seen that self-sustained pulsation is realized by increasing the total thickness of the quantum well layers to secure a sufficient volume for the saturable absorption regions 111.

In FIG. 6, the effective refractive index difference $\Delta n$ is set to about $3.2 \times 10^{-3}$. However, even if the effective refractive index difference Δn is reduced to about $2\times10^{-3}$ to about $3\times10^{-3}$, self-sustained pulsation also occurs where the total thickness of the quantum well layers is 0.030 μm or more.

Hereinafter, a relationship between the thickness of the first p-type cladding layer 104 and self-sustained pulsation characteristic will be described.

Figure 7:
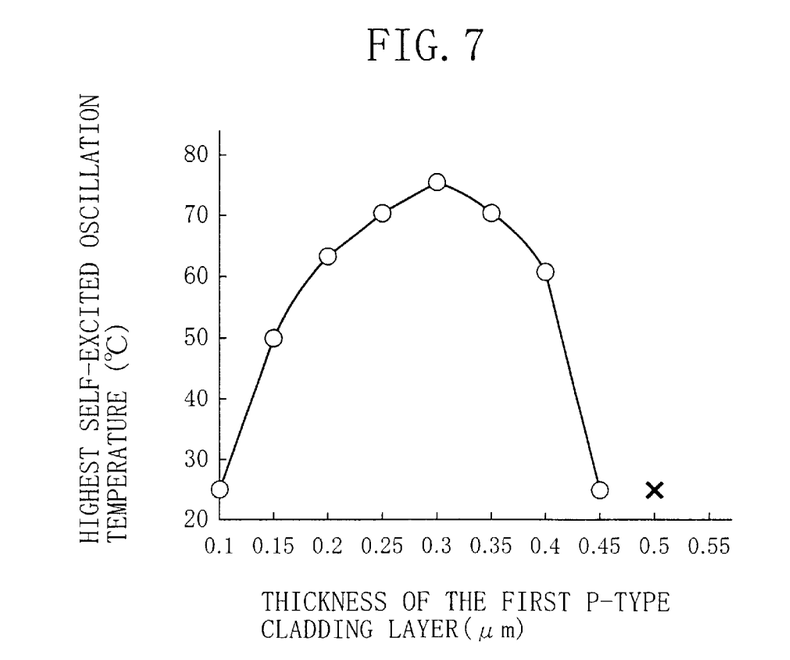
FIG. 7 is a graph representing a relationship between the thickness of the first p-type cladding layer and highest self-sustained pulsation temperature in the semiconductor laser device according to an embodiment of the present invention.

FIG. 7 represents a relationship between the thickness of the first p-type cladding layer 104 and highest self-sustained pulsation temperature (i.e., the highest temperature at which self-sustained pulsation is realized) where the effective refractive index difference Δn was set to about $3.2\times10^{-3}$ and the active layer 103 had a quantum well structure, in which eight well layers, each having a thickness of about 0.0053 μm, were stacked. In FIG. 7, ○ indicates that self-sustained pulsation occurred while X indicates that no self-sustained pulsation occurred.

As can be seen from FIG. 7, if the thickness of the first p-type cladding layer 104 is about 0.1 μm, oscillation is realized only at room temperature (25° C.). As the thickness of the first p-type cladding layer 104 is increased to about 0.3 μm, self-sustained pulsation occurs even at about 80° C.

On the other hand, if the thickness of the first p-type cladding layer 104 exceeds about 0.3 μm, the highest self-sustained pulsation temperature decreases. Until the thickness of the first p-type cladding layer 104 is about 0.45 μm, self-sustained pulsation is realized. However, if the thickness of the first p-type cladding layer 104 exceeds about 0.5 μm, self-sustained pulsation is no longer realized.

Accordingly, to cause the self-sustained pulsation, the thickness of the first p-type cladding layer 104 is preferably 0.1 μm or more and 0.45 μm or less. In order to realize self-sustained pulsation at about 60° C. or more, the thickness of the first p-type cladding layer 104 is preferably set to 0.2 μm or more and 0.4 μm or less.

What is claimed is:

1. A semiconductor laser device comprising:
   an active layer;
   a first cladding layer, which is formed on the active layer and is made of $(Al_{X1}Ga_{1-X1})_{Z1}In_{1-Z1}P$ (where $0\leq X1\leq 1$ and $0<Z1\leq 1$) of a first conductivity type;
   a striped region provided on the first cladding layer;
   a current blocking layer, which is formed on both sides of the striped region, provided on the first cladding layer and is made of $(Al_{Y}Ga_{1-Y})_{Z2}In_{1-Z2}P$ (where $0\leq Y\leq 1$ and $0<Z2<1$) of a second conductivity type; and
   a second cladding layer, which is formed at least in the striped region and is made of $(Al_{X2}Ga_{1-X2})_{Z3}In_{1-Z3}P$ (where $0\leq X2\leq 1$ and $0<Z3<1$) of a first conductivity type,
   wherein X1, X2 and Y have relationships represented as Y>X1 and Y>X2,
   wherein a laser light is produced from a region in a lower portion of the striped region in the active layer, and
   a saturable absorption region at the active layer for absorbing laser light produced from the active layer is provided directly below the current blocking layer in the active layer, and is provided beside and in contact with the region, which produces the laser light, in the active layer.

2. A semiconductor laser device according to claim 1, wherein an effective refractive index difference between the inside and outside of the striped region, which is a difference between first and second effective refractive indices, is equal to or greater than $2\times10^{-3}$ and equal to or smaller than $5\times10^{-3}$, the first effective refractive index being determined by a semiconductor multilayer structure existing inside the striped region to vertically sandwich the striped region therebetween and including the second and first cladding layers and the active layer, the second effective refractive index being determined by another semiconductor multilayer structure existing outside of the striped region to vertically sandwich the striped region therebetween and including the current blocking layer, the first cladding layer and the active layer.

3. A semiconductor laser device according to claim 1, wherein a bandgap energy of each of the first cladding layer, the current blocking layer and the second cladding layer is greater than an energy corresponding to an oscillation wavelength of the laser light produced from the active layer.

4. A semiconductor laser device according to claim 1, wherein the active layer has a quantum well structure formed by stacking multiple quantum well layers and barrier layers one upon the other, and
   wherein a total thickness of the quantum well layers is 0.03 μm or more.

5. A semiconductor laser device according to claim 1, wherein the first cladding layer has a thickness of 0.10 μm or more and 0.45 μm or less.

* * * * *